United States Patent
Muhammed et al.

(10) Patent No.: US 11,087,911 B2
(45) Date of Patent: Aug. 10, 2021

(54) AUTONOMOUS MODE CHANGE CIRCUIT FOR SOLENOID DRIVERS

(71) Applicant: Hamilton Sundstrand Corporation, Charlotte, NC (US)

(72) Inventors: Shihab T. A. Muhammed, Kerela (IN); Pradeep Chitirala, Karnataka (IN); Shardul Shrinivas Bapat, Karnataka (IN)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 255 days.

(21) Appl. No.: 16/238,674

(22) Filed: Jan. 3, 2019

(65) Prior Publication Data

US 2020/0135373 A1    Apr. 30, 2020

(51) Int. Cl.
| | |
|---|---|
| *H01H 47/00* | (2006.01) |
| *H01F 7/18* | (2006.01) |
| *H01F 7/06* | (2006.01) |
| *H01F 7/08* | (2006.01) |
| *H03K 3/037* | (2006.01) |
| *H02M 3/04* | (2006.01) |

(52) U.S. Cl.
CPC .......... *H01F 7/1805* (2013.01); *H01F 7/064* (2013.01); *H01F 7/081* (2013.01); *H03K 3/037* (2013.01); *H01F 2007/1888* (2013.01); *H02M 3/04* (2013.01)

(58) Field of Classification Search
None
See application file for complete search history.

(56) References Cited

U.S. PATENT DOCUMENTS

| | | | |
|---|---|---|---|
| 4,355,619 A | 10/1982 | Wilkinson | |
| 4,764,840 A | 8/1988 | Petrie et al. | |
| 5,803,197 A * | 9/1998 | Hara | B60K 23/0808 |
| | | | 180/248 |
| 5,812,355 A | 9/1998 | Nojima | |
| 6,061,224 A | 5/2000 | Allen | |
| 9,496,079 B2 | 11/2016 | Khayzikov et al. | |
| 2003/0178070 A1* | 9/2003 | Glicken | F17D 5/02 |
| | | | 137/624.11 |
| 2010/0108030 A1 | 5/2010 | Kusaka et al. | |
| 2013/0088208 A1 | 4/2013 | Noda | |
| 2017/0062110 A1* | 3/2017 | Matsumoto | H01F 7/064 |
| 2017/0288529 A1 | 10/2017 | Wenske et al. | |
| 2018/0097443 A1 | 4/2018 | Couleur et al. | |

OTHER PUBLICATIONS

Extended European Search Report for Application No. 19206345.1-1203; dated Feb. 14, 2020; 10 pages.
Communication Pursuant to Article 94(3) EPC dated Apr. 16, 2021 for European Patent Application No. 19206345.1.

\* cited by examiner

*Primary Examiner* — Stephen W Jackson
(74) *Attorney, Agent, or Firm* — Cantor Colburn LLP (57) ABSTRACT

Provided are embodiments for operating an autonomous mode change circuit for solenoid drivers. The embodiments include initiating an operation of a solenoid, and receiving a command to control the operation of the solenoid. The embodiments also include controlling, by a drive circuit, a switch coupled to the solenoid based at least in part on the command, and detecting at least one of a current or voltage of the solenoid, and subsequently controlling the operation of the solenoid based at least in part on the detection.

16 Claims, 9 Drawing Sheets

AUTONOMOUS MODE CHANGE CIRCUIT FOR SOLENOID DRIVERS

CROSS-REFERENCE TO RELATED APPLICATIONS

This application claims the benefit of Indian Application No. 201811041108 filed Oct. 31, 2018, which is incorporated herein by reference in its entirety.

BACKGROUND

The present disclosure relates generally to control systems, and more specifically to an autonomous mode change circuit for solenoid drivers.

Electromechanical solenoids are used in valves, relays, and contactors. These solenoids consist of an electromagnetically inductive coil wound around a moveable steel or iron slug called the armature or plunger. Solenoid drive circuits used to power the electromechanical solenoid coils are typically either "voltage-controlled" or "current-controlled."

A voltage controlled solenoid drive circuit applies a regulated, rated voltage to energize an electromechanical solenoid. Applying the full rated voltage continuously results in a higher power dissipation within the drive circuit and the solenoid. Hence, a variation of the voltage controlled drive circuit applies the full regulated voltage to "Pull-in" the solenoid and then a reduced voltage to "Hold" the solenoid in its engaged position.

BRIEF SUMMARY

According to an embodiment, an autonomous mode change circuit for solenoid drivers is provided. The circuit includes a solenoid coupled to a switch; a processor configured to initiate an operation of the solenoid; a drive circuit coupled to the processor and coupled to the switch, the drive circuit configured to receive a command to control an operation of the solenoid; and a detector for detecting at least one of a current or voltage of the solenoid, wherein the detector is coupled to the drive circuit.

In addition to one or more of the features described herein, or as an alternative, further embodiments include a drive circuit that is at least one of a pulse-width modulated (PWM) based current drive circuit or a DC-DC converter circuit.

In addition to one or more of the features described herein, or as an alternative, further embodiments include a timer-based circuit coupled to the drive circuit, wherein the timer-based circuit comprising a monostable multivibrator and a D-flip flop circuit.

In addition to one or more of the features described herein, or as an alternative, further embodiments include using a command to control the operation of the solenoid is received from the timer-based circuit.

In addition to one or more of the features described herein, or as an alternative, further embodiments include a drive circuit that is a PWM-based current drive circuit and is coupled to a comparator-based autonomous mode change circuit including a comparator, wherein the command to control an operation of the solenoid is determined by the comparator.

In addition to one or more of the features described herein, or as an alternative, further embodiments include a comparator that determines if the duty cycle of the PWM-based current drive circuit is greater than a reference signal, the command is a Pull-in mode command, or otherwise the command is a Hold mode command.

In addition to one or more of the features described herein, or as an alternative, further embodiments include a drive circuit that is the DC-DC converter coupled to a current sense amplifier and a comparator with hysteresis, wherein the comparator with hysteresis is configured to control a gain of the current sense amplifier based on the detector.

In addition to one or more of the features described herein, or as an alternative, further embodiments include a current sense amplifier configured to send a feedback signal to the DC-DC converter to select an output voltage to supply the solenoid.

In addition to one or more of the features described herein, or as an alternative, further embodiments include responsive to the detector detecting if the solenoid current has reached a maximum pull-in current, switching the solenoid from a first mode to a second mode, wherein the first mode is a Pull-in mode and the second mode is a Hold mode.

In addition to one or more of the features described herein, or as an alternative, further embodiments include responsive to the detector detecting if a solenoid current is less than the designed value of hold current, switching the solenoid from a second mode to a first mode, wherein the first mode is a Pull-in mode and the second mode is a Hold mode.

According to another embodiment, a method for operating an autonomous mode change circuit for solenoid drivers is provided. The method includes initiating, by a processor, an operation of a solenoid; receiving a command to control the operation of the solenoid; controlling, by a drive circuit, a switch coupled to the solenoid based at least in part on the command; and detecting at least one of a current or voltage of the solenoid, and subsequently controlling the operation of the solenoid based at least in part on the detection.

In addition to one or more of the features described herein, or as an alternative, further embodiments include a drive circuit that is at least one of a pulse-width modulated (PWM) based current drive circuit or a DC-DC converter circuit.

In addition to one or more of the features described herein, or as an alternative, further embodiments include a timer-based circuit that is coupled to the drive circuit, wherein the timer-based circuit including a monostable multivibrator and a D-flip flop circuit.

In addition to one or more of the features described herein, or as an alternative, further embodiments include using a command to control the operation of the solenoid received from the timer-based circuit.

In addition to one or more of the features described herein, or as an alternative, further embodiments include a drive circuit is a PWM-based current drive circuit and is coupled to a comparator-based autonomous mode change circuit including a comparator, wherein the command to control an operation of the solenoid is determined by the comparator.

In addition to one or more of the features described herein, or as an alternative, further embodiments include determining if the duty cycle of the PWM-based current drive circuit is greater than a reference signal, the command is a Pull-in mode command, or otherwise the command is a Hold mode command.

In addition to one or more of the features described herein, or as an alternative, further embodiments include a drive circuit that is a DC-DC converter coupled to a current sense amplifier and a comparator with hysteresis, wherein the comparator with hysteresis is configured to control a gain of the current sense amplifier based on the detector.

In addition to one or more of the features described herein, or as an alternative, further embodiments include a current sense amplifier that is configured to send a feedback signal to the DC-DC converter to select an output voltage to supply the solenoid.

In addition to one or more of the features described herein, or as an alternative, further embodiments include responsive to detecting if a solenoid current has reached a maximum pull-in current, switching the solenoid from a first mode to a second mode, wherein the first mode is a Pull-in mode and the second mode is a Hold mode.

In addition to one or more of the features described herein, or as an alternative, further embodiments include responsive to detecting if a solenoid current is less than a maximum hold current, switching the solenoid from a second mode to a first mode, wherein the first mode is a Pull-in mode and the second mode is a Hold mode.

Technical effects of embodiments of the present disclosure include providing a simple hardware-based circuit topology that automatically switches the solenoid operating modes. The hardware-based circuit topology switches from the "Pull-in" mode to the "Hold" mode to conserve power during normal operation. If the solenoid is operating in the "Hold" mode and then disengages due to an intermittent power interruption or due to a solenoid fault condition (open/short), the circuit automatically switches back to the "Pull-in" mode to re-engage the solenoid once power is restored or recovered from a fault.

The techniques described herein do not require additional software overhead while switching between the solenoid operating modes especially for LRU driving multiple solenoids, simplifying the software configuration of the system.

The foregoing features and elements may be combined in various combinations without exclusivity, unless expressly indicated otherwise. These features and elements as well as the operation thereof will become more apparent in light of the following description and the accompanying drawings. It should be understood, however, that the following description and drawings are intended to be illustrative and explanatory in nature and non-limiting.

BRIEF DESCRIPTION OF THE DRAWINGS

The present disclosure is illustrated by way of example and not limited in the accompanying figures in which like reference numerals indicate similar elements.

DETAILED DESCRIPTION

Typically in safety-critical aerospace applications if there is an intermittent power interruption whilst a line replaceable unit (LRU) is in a particular state, it needs to return to the same state once power is restored. The LRUs that employ solenoid drives are often at the lowest level in a control system and rely on commands from the upper-level sub-system to operate the solenoids. The solenoid coils need more current during actuation, called the "Pull-in" current, to pull the plunger into the solenoid when compared to the current used to hold the plunger in position. However, once the solenoid is actuated the coil only needs approximately 20-30% of its nominal current, called the "hold" current, to keep the plunger in its engaged position. Solenoid drive circuits operate the solenoid with "pull-in" current initially and then switch to the "hold" mode to conserve power.

Circuits typically do not have the capability to switch back from a "hold" mode to a "pull-in" mode in the event of power interruptions. Some circuits operate in a continuous pull-in mode leading to excessive waste of power. The automatic change over from "Hold" mode to the "Pull-in" mode can be implemented in software by monitoring the solenoid power supply but it is an added overhead to the software especially when the processor runs a control loop involving multiple solenoids. The techniques described herein provide a hardware solution for switching from the "Pull-in" mode to the "Hold" mode for operating the solenoid and vice versa.

Figure 1:
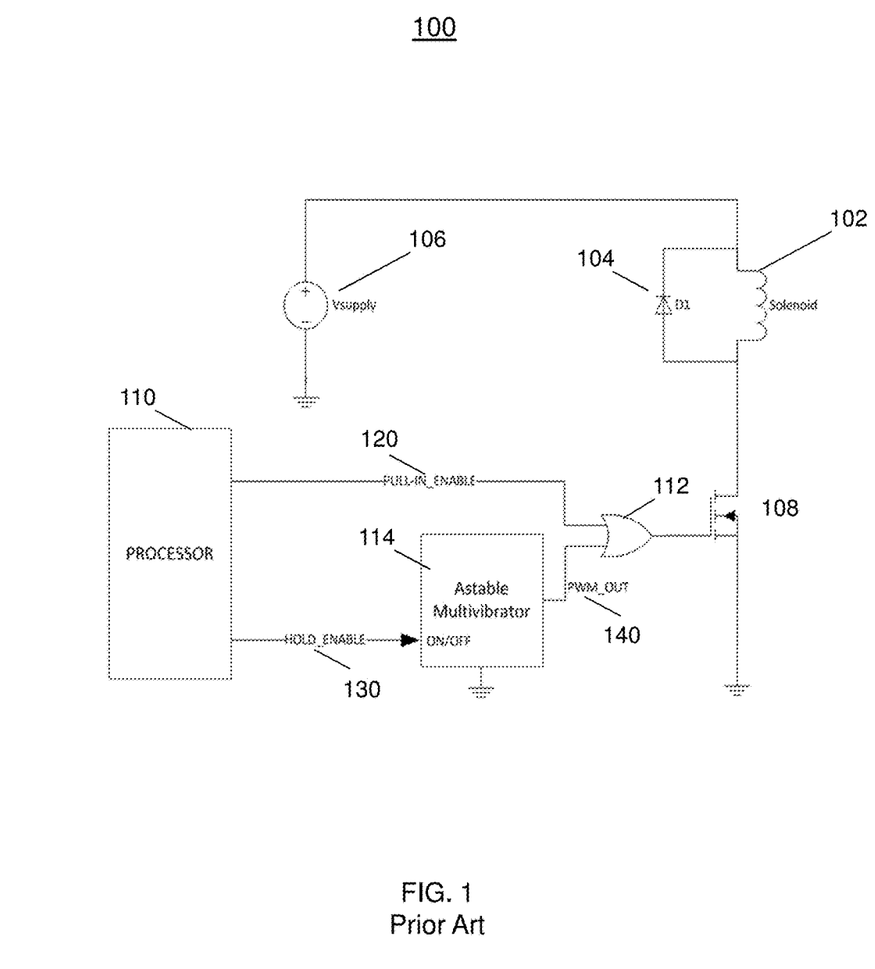
FIG. 1 depicts a voltage-based solenoid driver circuit.

FIG. 1 depicts a prior art configuration of a circuit 100 for a voltage-based solenoid driver. The circuit 100 includes a solenoid 102 that is coupled to a diode 104. The solenoid 102 is configured to receive a supply voltage from a voltage supply source 106. The solenoid 102 is coupled to the switch 108 which is under the control of the processor 110. The processor 110 is configured to send commands (Hold_Enable signal 130) to a multivibrator circuit 114 which operates to send a signal (PWM_OUT signal 140) to the switch 108 according to a pre-determined interval. The output signal (Pull-in_Enable signal 120) from the processor 110 and the output of the multivibrator circuit 114 is coupled to the logic OR gate 112 to control the switch 108. When energized, a voltage controlled solenoid drive circuit operates in the "pull-in" mode for a fixed period of time (pull-in interval), then changes to a "hold" mode after the pull-in interval. The interval is set by hardware or by a processor/controller software.

Figure 2:
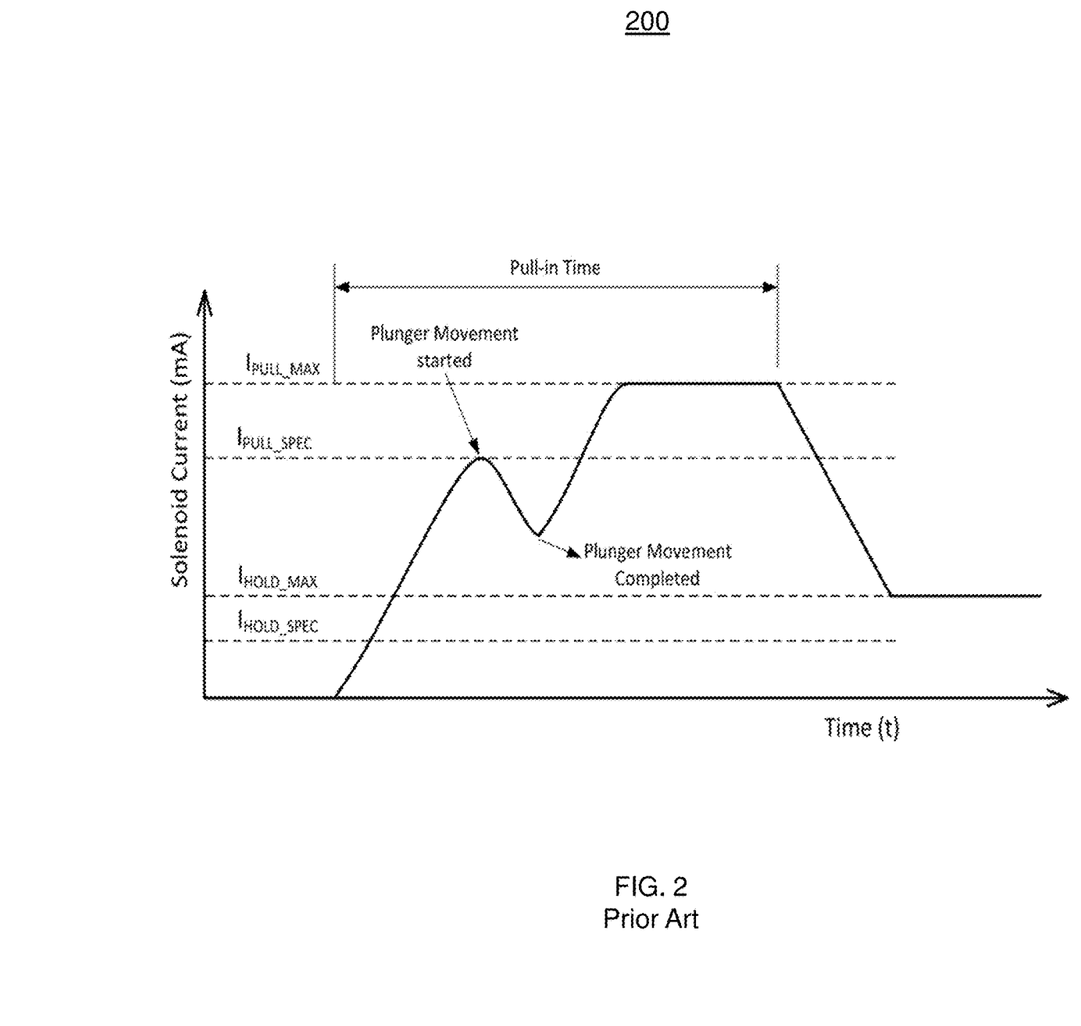
FIG. 2 depicts a waveform of the voltage-based solenoid driver circuit.

FIG. 2 depicts a waveform 200 for the operation of the voltage-based solenoid drive circuit 100. The x-axis of the waveform 200 measures time (t) and the y-axis measures the solenoid current (mA). The design for the hold current is selected above the HOLD specification threshold. Because the solenoid current will exhibit ripple at switching frequency depending on the solenoid inductance, coil resistance and other impedances on the charging and discharging path, the maximum Pull-in current is selected to be higher than the specification Pull-in current for the solenoid.

The current $I_{PULL\_MAX}$, which is the final solenoid pull-in current governed by the supply voltage and coil resistance, is configured to be greater than the current $I_{PULL\_SPEC}$ which is the minimum "Pull-in" current as per a solenoid datasheet defining the operating parameters of various types of solenoids. This is done by selecting an appropriately higher supply voltage since the current is not directly controlled. The current $I_{HOLD\_MAX}$, which is the final solenoid "Hold" current governed by the supply voltage and coil resistance, is configured to be greater than the current $I_{HOLD\_SPEC}$, which is the minimum "Hold" current as per the solenoid datasheet. During the ramp-up phase, the plunger will begin to move when the solenoid current reaches the current $I_{PULL\_SPEC}$. After the plunger is completely pulled-in the solenoid current will continue until it reaches $I_{PULL\_MAX}$ and will remain at that level for the predetermined interval before transitioning to the $I_{HOLD\_MAX}$. It is to be noted that in voltage controlled drive circuits, a higher supply voltage needs to be selected to maintain the Pull-in or Hold current above the datasheet specifications to account for temperature and coil resistance variations. Therefore, a higher power dissipation results.

Figure 3:
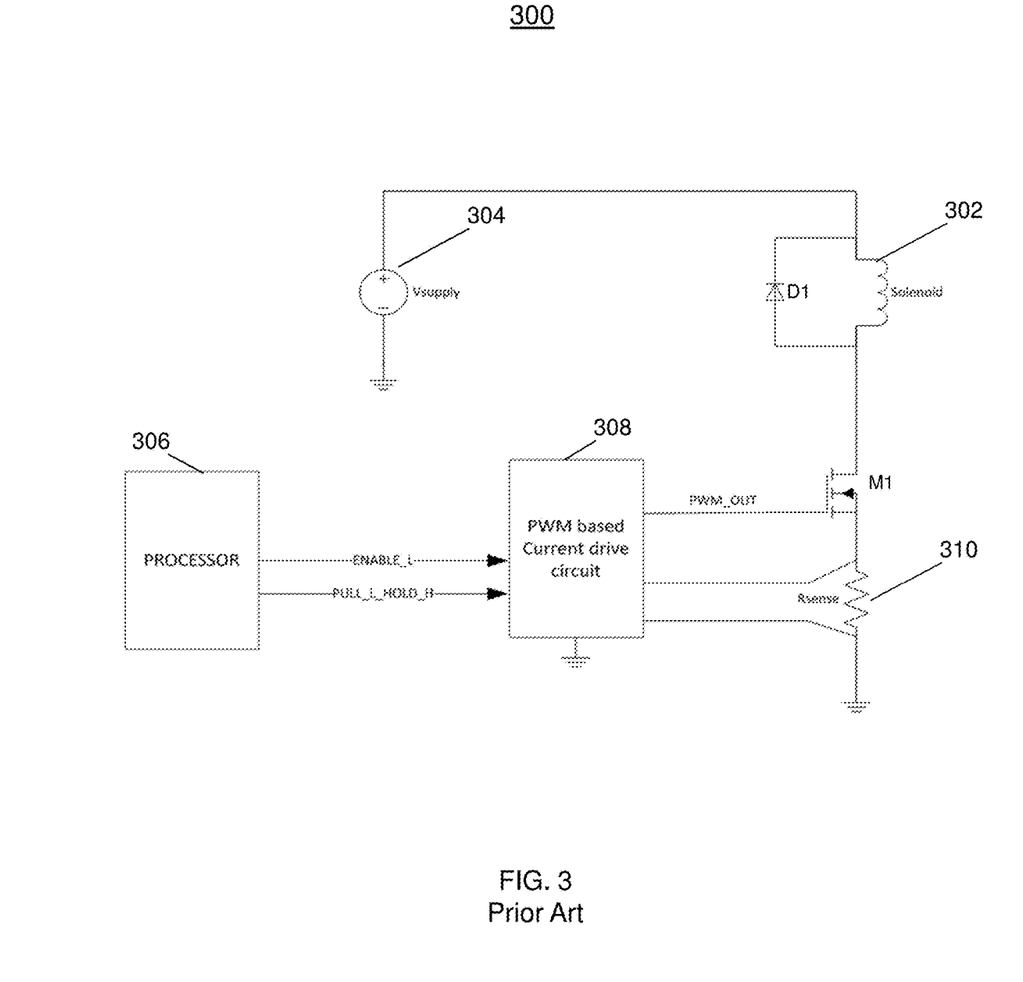
FIG. 3 depicts a PWM-based solenoid drive circuit.

FIG. 3 depicts a prior art PWM-based current controlled solenoid drive circuit 300. The circuit 300 includes a solenoid 302 having a diode D1 that is coupled to the voltage supply 304. In addition, the solenoid 302 is coupled to a switch M1 that is under the control of the processor and PWM-based current drive circuit 308. The PWM-based current drive circuit 308 can include a comparator. The output of the PWM-based current drive circuit 308 will be in a maximum duty cycle until the voltage across the sense resistor 310 reaches the required voltage at the comparator based on the Pull-in current. Responsive to reaching the current, the PWM duty cycle reaches a steady state and the duty cycle will be decided based on the supply voltage, solenoid inductance, coil resistance, etc. These parameters can affect the rise time of the current waveform through the sense resistor (also the voltage waveform). The ON time of the PWM output is equal to the rise time sense resistor waveform to reach the comparing voltage set at the comparator.

Figure 4:
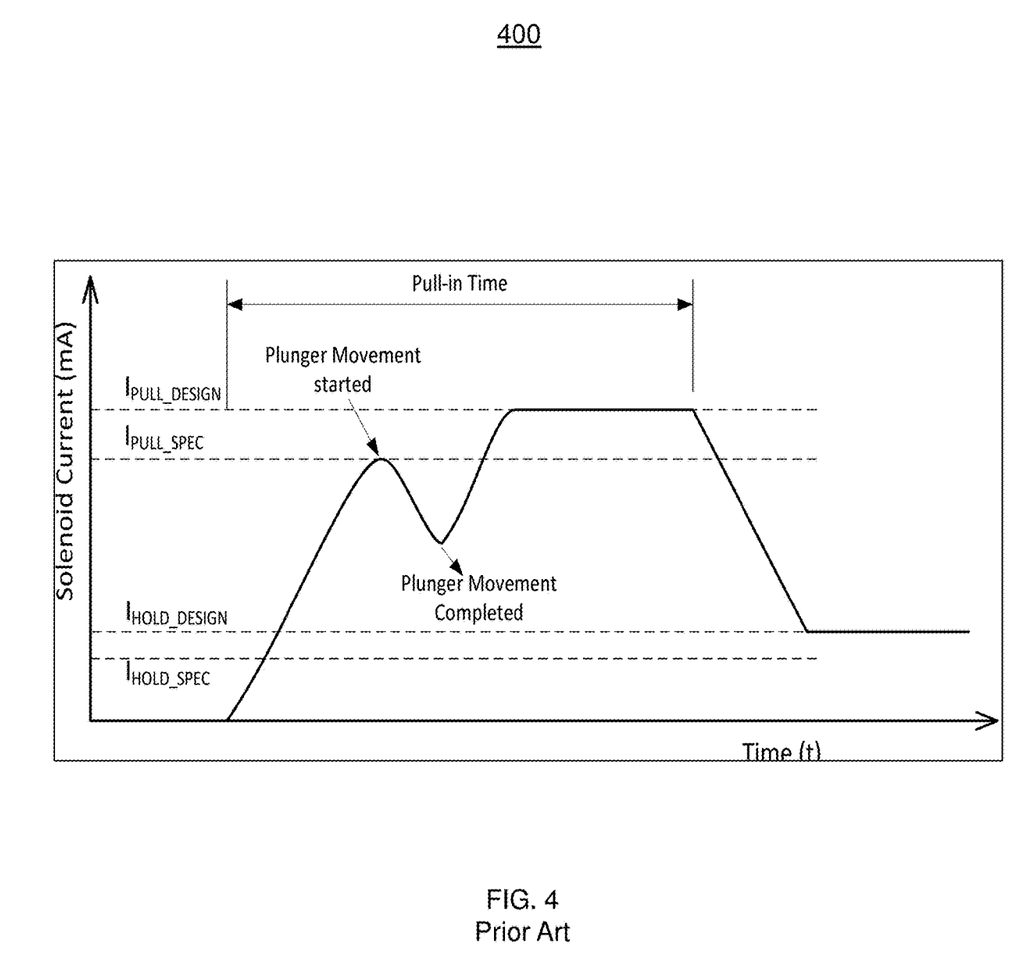
FIG. 4 depicts a waveform of the PWM-based solenoid drive circuit.

FIG. 4 depicts a waveform for the operation of the circuit 300. Responsive to receiving the "Enable" signal and the "Pull-in" signal from the processor 306 the output solenoid current begins to increase. Since the $I_{PULL\_DESIGN}$, which is the solenoid Pull-in current as per circuit design in a current-based solenoid drive, is greater than the $I_{PULL\_SPEC}$, which is the minimum Pull-in current as per the solenoid datasheet, the plunger will begin to move prior to reaching the $I_{PULL\_DESIGN}$. After reaching the $I_{PULL\_DESIGN}$, the solenoid current will remain at that level for a predetermined interval before changing to the "Hold" state and maintaining the current $I_{HOLD\_DESIGN}$, which is the solenoid Hold current as per the circuit design in a current-based solenoid drive that is configured higher than the current $I_{HOLD\_SPEC}$, which is the minimum Hold current as per the solenoid datasheet. It is to be noted in the current controlled drive circuit, the supply voltage can be optimally selected since the current is directly controlled despite temperature and coil resistance variations, thereby reducing the power dissipation. The Pull-in duration is governed by processor software and is typically set longer than strictly required since the solenoid current sense is not available to the processor.

Figure 5:
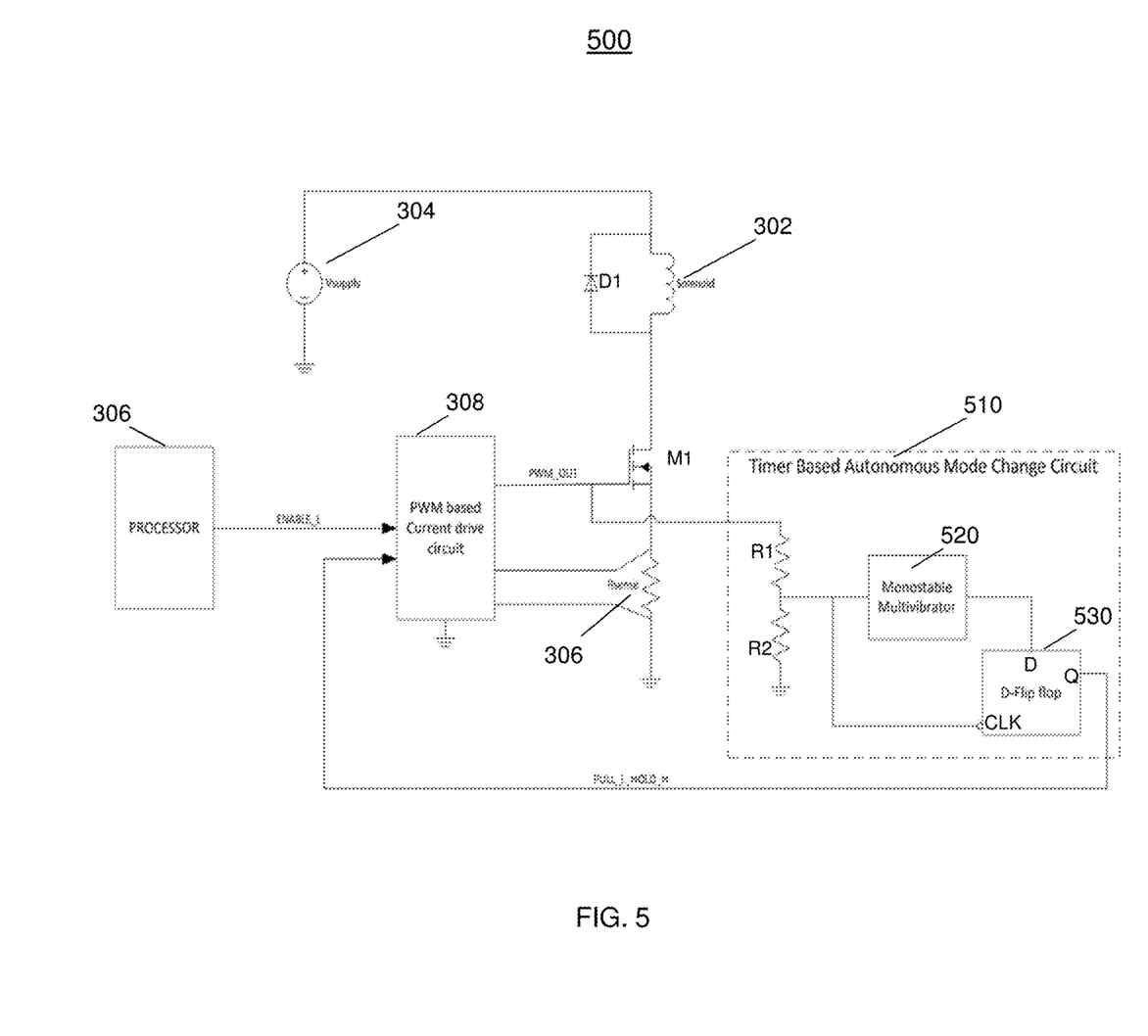
FIG. 5 depicts a circuit including a timer-based autonomous mode change circuit in accordance with one or more embodiments.

In FIG. 5, a circuit 500 including a timer-based autonomous mode change circuit in accordance with one or more embodiments is shown. The circuit 500 is configured to automatically change over the modes between the "Pull-in" mode and the "Hold" mode based on the duty of the PWM of the circuit 500. The circuit 500 includes a similar configuration as FIG. 3 and further has a timer-based autonomous mode change circuit 510 (hereinafter referred to as the timer circuit 510). The timer circuit 510 includes a monostable multivibrator 520 and a D-flip flop 530.

Since the $I_{PULL\_DESIGN}$ is greater than the $I_{PULL\_SPEC}$, the solenoid's plunger movement occurs before the solenoid current reaches the $I_{PULL\_DESIGN}$. Using the PWM based peak current mode solenoid drive, the PWM duty cycle will be at maximum until the solenoid 302 current reaches $I_{PULL\_PEAK}$. Once the solenoid current reaches $I_{PULL\_PEAK}$, within a couple of PWM cycles the steady-state condition will be attained and the average current flowing through the solenoid will be the current $I_{PULL\_DESIGN}$ and the PWM duty cycle will be less than 80% (as per the design where the supply voltage is selected accordingly to meet this criterion).

The monostable multivibrator 520 is configured with a reset time of 90% of the PWM switching period and it is triggered on the rising edge of the PWM signal from the PWM circuit 308. A voltage divider circuit (including resistors R1, R2) is used to attenuate the PWM_OUT signal from the PWM circuit 308 as it may be of higher voltage level compared to the operating voltage range of digital integrated circuits (ICs). The clock (CLK) of D Flip flop 530 is falling edge sensitive. So the D flip-flop output (Q) will be LOW as long as the PWM_OUT duty cycle is greater than 90% of the PWM switching period. Once the solenoid current reaches $I_{PULL\_DESIGN}$ the duty cycle will fall below 90% and then the D flip-flop output (Q) will go HIGH. Inside PWM circuit block there is a current sense amplifier whose gain will be changed based on the D flip-flop output (Q) to switch from 'Pull-in' current to 'Hold' current.

In the event of a solenoid power supply interruption while in the "Hold" mode, the solenoid will begin discharging its energy through the diode D1. When the power supply is restored the PWM driver will start its operation and the PWM duty cycle will go to a maximum and enter the "Pull-in" mode. After the current reaches the peak current, the duty cycle of the PWM will return to the reduced "hold" mode threshold.

In the event power is interrupted while transitioning between the "Pull-in" mode to the "Hold" mode and is restored before the solenoid current discharges below the "Hold" current limit, the solenoid will continue in the "Hold" mode. If the power is restored after the solenoid has discharged below "Hold" current limit then the solenoid mode will be changed to the "Pull-in" mode and continue operation.

In the event a power interruption occurs when the solenoid current is between the "Hold" current and the "Pull-in" current while in pull-in mode, the solenoid will start discharging through the diode but there will be no mode change. When the power is restored the solenoid current will ramp towards the current $I_{PULL\_DESIGN}$.

Figure 6:
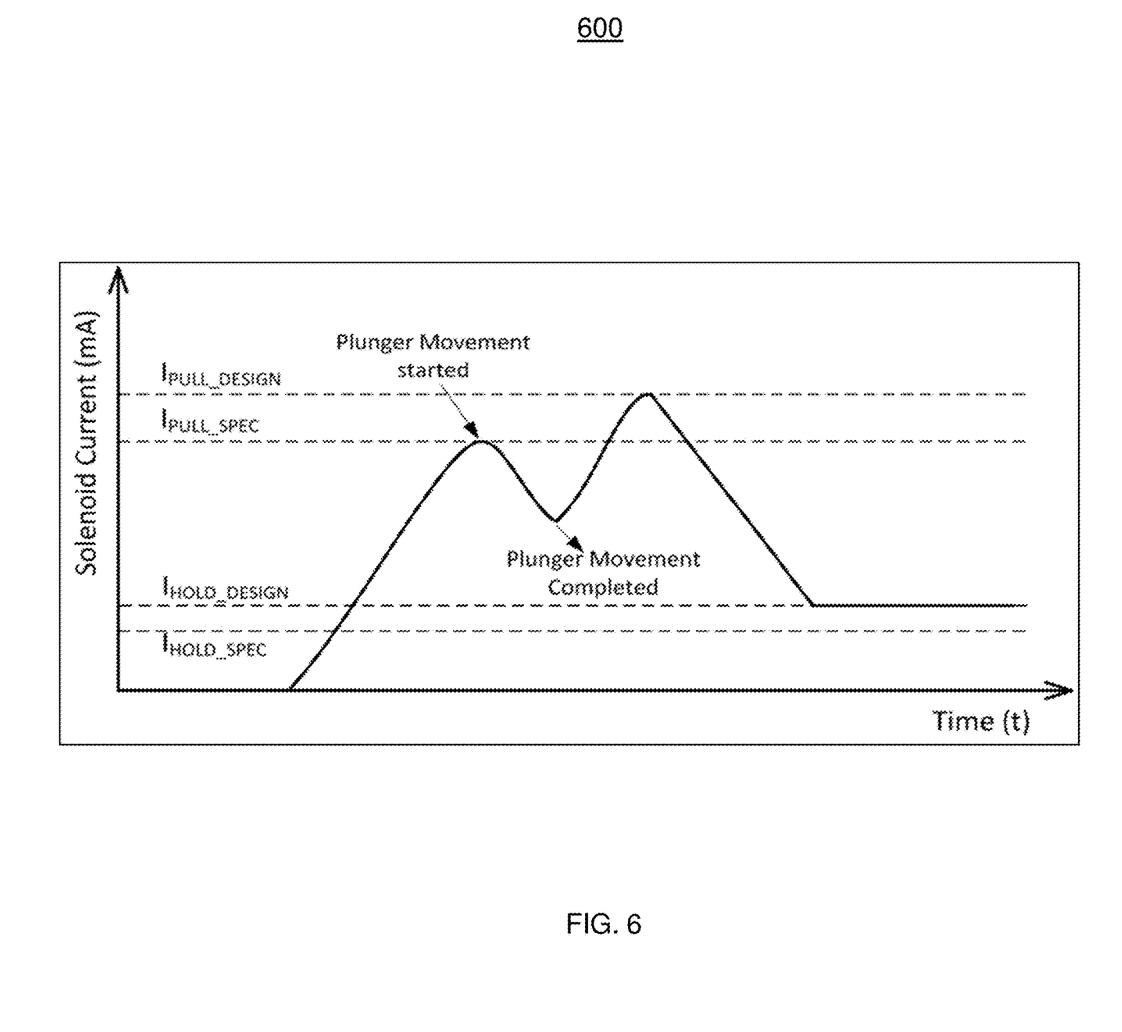
FIG. 6 depicts a waveform of the timer-based autonomous mode change circuit in accordance with one or more embodiments.

FIG. 6 depicts a waveform 600 for the operation of the circuit 500. As shown in FIG. 6, the current $I_{PULL\_DESIGN}$ is configured to be greater than the current $I_{PULL\_SPEC}$. Therefore, during the "Pull-in" mode the plunger of the solenoid will begin to move when the solenoid current reaches the current $I_{PULL\_SPEC}$. After the dip in the solenoid current (caused by the inductance of the solenoid) the solenoid current will increase until it reaches the current $I_{PULL\_DESIGN}$. After the current $I_{PULL\_DESIGN}$ is reached the solenoid will enter the "Hold" mode and the current will be maintained at the current $I_{HOLD\_DESIGN}$, where the $I_{HOLD\_DESIGN}$ is set greater than the $I_{HOLD\_SPEC}$. In one or more embodiments, there is no processor that is used to control the switchover from the Pull-in mode to the Hold mode, so the Pull-in duration is kept at a minimum. Once the solenoid current reaches the $I_{PULL\_DESIGN}$, the circuit automatically switches to the Hold mode, thereby keeping the power dissipation to a minimum.

Figure 7:
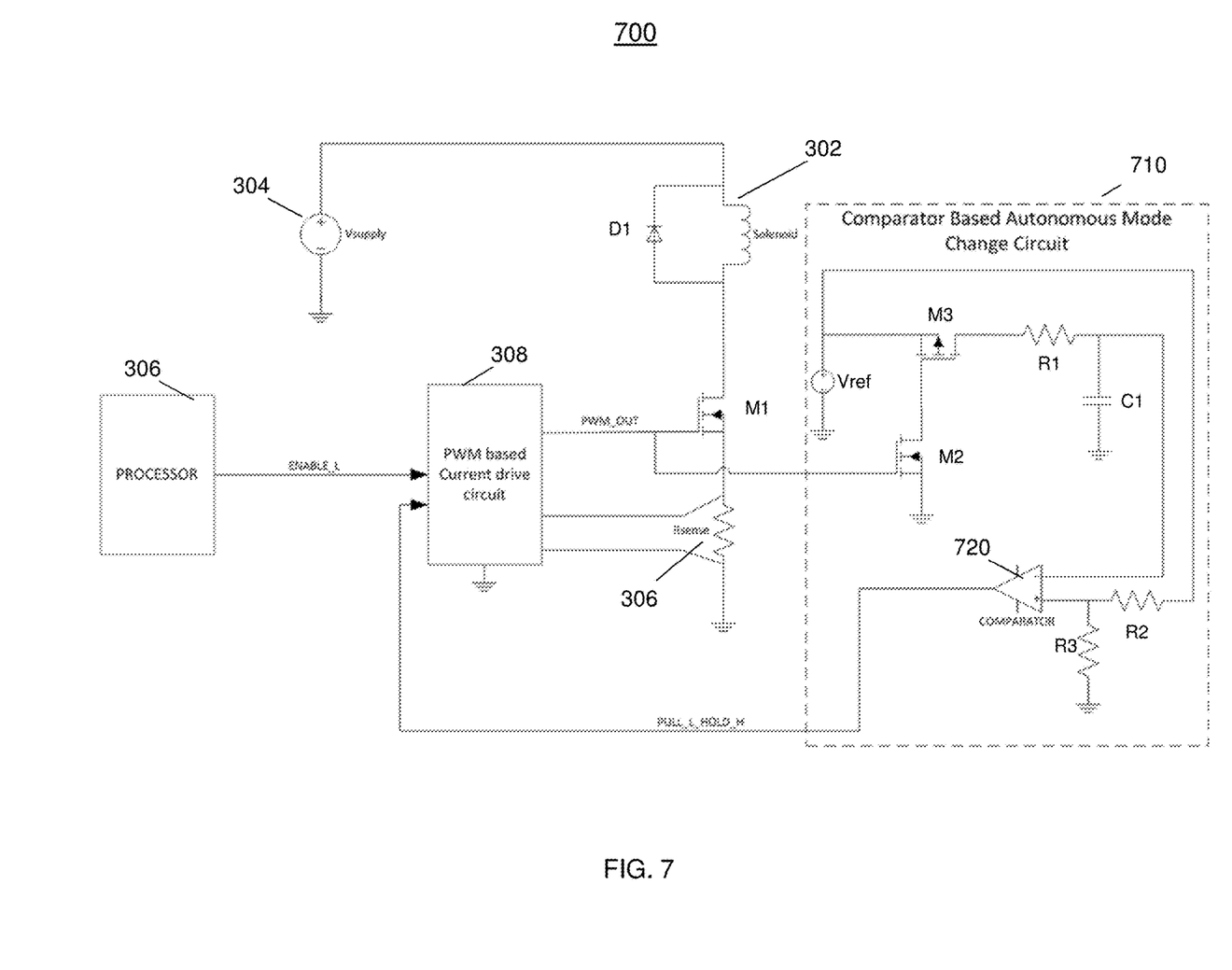
FIG. 7 depicts a circuit including a comparator-based autonomous mode change circuit in accordance with one or more embodiments.

FIG. 7 depicts a circuit 700 including a comparator based autonomous mode change circuit 710 in accordance with one or more embodiments. The circuit 700 has a similar configuration as shown in FIG. 3 and further includes a comparator-based autonomous mode change circuit 710 (hereinafter referred to as comparator circuit 710). In some PWM driver circuits such as PWM circuit 308, the switching frequency and the PWM voltage amplitudes may not be tightly controlled due to factors such as the wide operating temperature range of the circuit 700. In that situation, the comparator circuit 710 circuit can be used. The comparator 720 is configured to receive the PWM_OUT from the PWM circuit 308 and a Vref signal. The non-inverting input of the comparator 720 receives a reference voltage supplied by the voltage supply source Vref and the voltage divider circuit including resistors R2, R3. The inverting input of the comparator 720 receives a filtered DC voltage equivalent to the PWM duty cycle. Using the switches M2, M3 and a precision voltage "Vref", the PWM_OUT of the PWM circuit 308 is converted to a PWM signal with precise voltage amplitude. The RC filter (resistor R1, capacitor C1) converts the PWM signal to equivalent DC voltage. The positive terminal of the comparator 720 is supplied with 90% of Vref which represents 90% duty cycle. So until the solenoid current reaches $I_{PULL\_DESIGN}$, the output of the comparator 720 will be LOW (PULL_L_HOLD_H=LOW) and responsive to the solenoid current reaching $I_{PULL\_DESIGN}$, it changes to HIGH causing the solenoid to enter the "Hold" mode.

Figure 8:
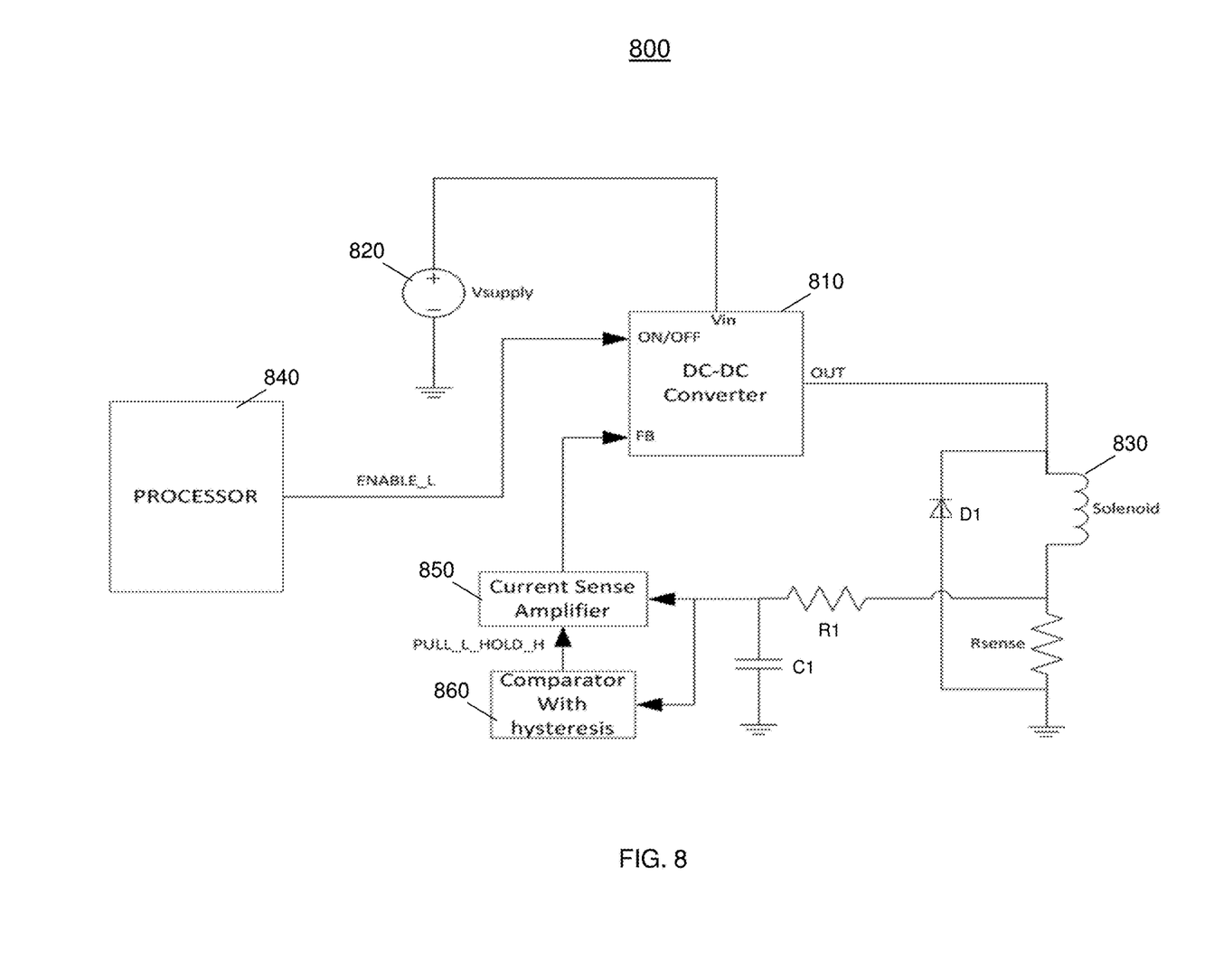
FIG. 8 depicts a circuit including a variable output DC-DC converter circuit in accordance with one or more embodiments.

Now referring to FIG. 8, a circuit 800 including a variable output DC-DC converter 810 is shown. The DC-DC converter 810 (hereinafter referred to as converter 810) receives a voltage supply from a voltage supply source 820 and is also coupled to the solenoid 830. The converter 810 can include any type of DC-DC converter topology. The converter 810 includes an ON/OFF pin and a feedback pin (FB). The processor 840 is configured to send an "Enable" signal to operate the converter 810. The converter 810 is configured to output a DC signal to the solenoid 830 that includes a diode D1 and a sense resistor Rsense. The current sense amplifier 850 is configured to detect the current of the solenoid 830 via the sense resistor. In one or more embodiments the current sense signal from the solenoid can be filtered using RC filter (R1, C1).

The amplifier is also configured to receive an input from a comparator with hysteresis 860. The comparator with hysteresis 860 can be used to change the gain of the current sense amplifier. The comparator changes the state when the solenoid current reaches the current $I_{PULL\_DESIGN}$ to switch the circuit 800 into the "Hold" mode. When the solenoid current detected via the sense resistor falls below the current $I_{HOLD\_SPEC}$, then, the comparator 860 changes the state to switch the solenoid 830 into the "Pull-in" mode. The output of the current sense amplifier 850 is provided to the converter 810 as feedback to control the output DC level of the converter 810 provided to the solenoid 830.

Figure 9:
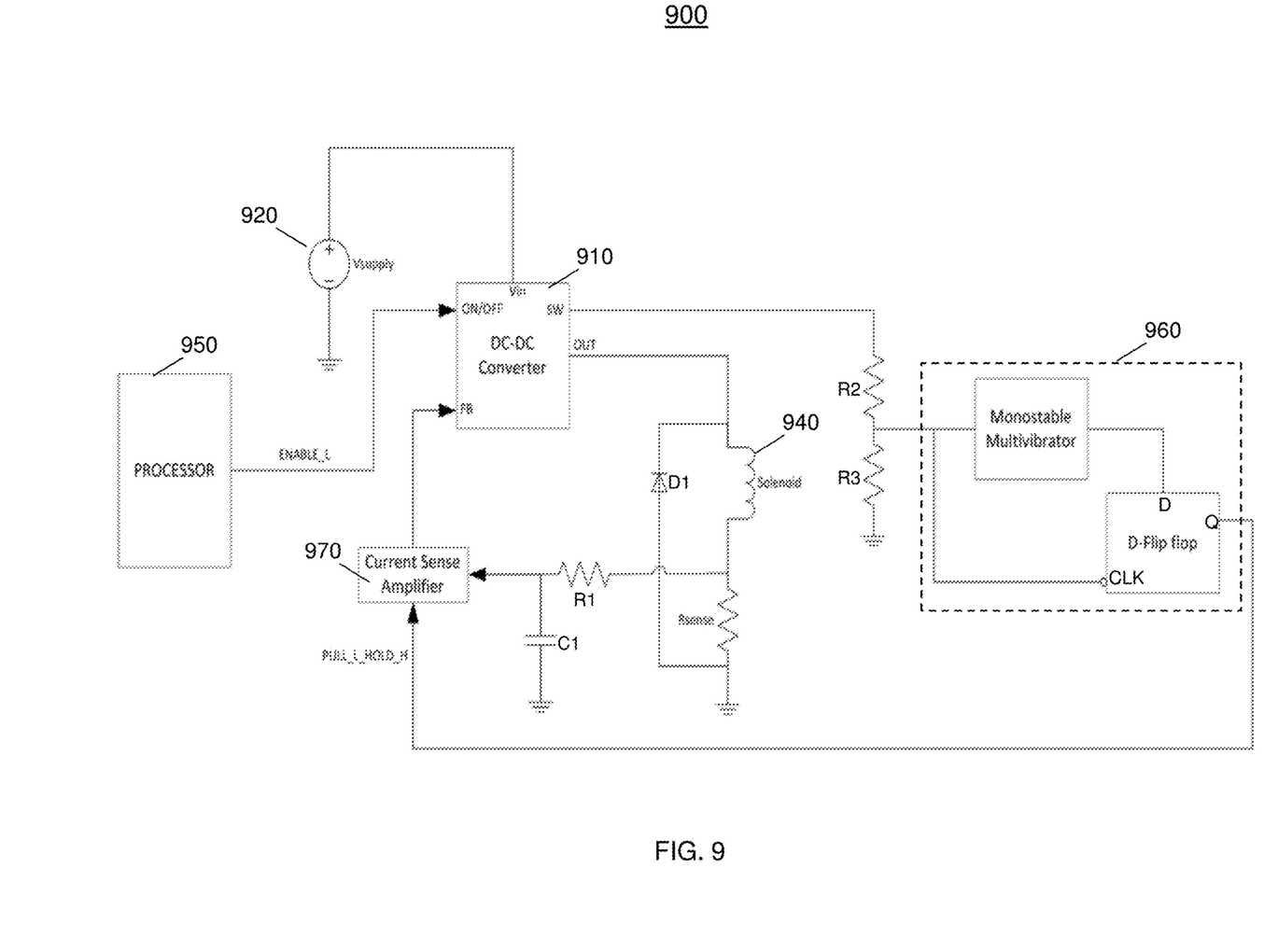
FIG. 9 depicts a circuit including a variable output DC-DC converter circuit and timer circuit in accordance with one or more embodiments.

Now referring to FIG. 9, a circuit 900 combining a DC-DC converter and timer-based circuit is shown. The circuit 900 includes a DC-to-DC converter 910, a voltage supply 920, solenoid 940 and processor 950. The converter 910 sends signals to control the solenoid 940. The timer-based mode change circuit (timer circuit 960) operates in a similar manner as the timer circuit 510 shown in FIG. 5. The timer circuit 960 is configured to receive a signal from the converter 910. The converter 910 includes a switching node (SW) that provides a PWM signal to trigger the timer circuit 960. The output signal (PULL_L_HOLD_H) of the timer circuit 960 is used to select the mode of the solenoid by sending the output signal to the current sense amplifier 970. The output signal controls the gain of the amplifier and sends a feedback signal to the converter 910.

The technical effects and benefits include providing a simple hardware-based circuit topology that automatically switches the solenoid operating modes. It switches the current from the Pull-in mode to a Hold mode to conserve power during normal operation. If the solenoid is operating in the Hold mode and then disengages due to an intermittent power interruption or due to a solenoid fault condition (open/short), the circuit automatically switches back to the Pull-in mode to re-engage the solenoid once power is restored or recovered from fault.

In addition, the technical effects and benefits include that no additional software overhead is required using the architectures described herein.

The term "about" is intended to include the degree of error associated with measurement of the particular quantity and/or manufacturing tolerances based upon the equipment available at the time of filing the application.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

Those of skill in the art will appreciate that various example embodiments are shown and described herein, each having certain features in the particular embodiments, but the present disclosure is not thus limited. Rather, the present disclosure can be modified to incorporate any number of variations, alterations, substitutions, combinations, sub-combinations, or equivalent arrangements not heretofore described, but which are commensurate with the scope of the present disclosure. Additionally, while various embodiments of the present disclosure have been described, it is to be understood that aspects of the present disclosure may include only some of the described embodiments. Accordingly, the present disclosure is not to be seen as limited by the foregoing description, but is only limited by the scope of the appended claims.

What is claimed is:

1. A system comprising:
   a solenoid coupled to a switch;
   a processor configured to initiate an operation of the solenoid;
   a drive circuit coupled to the processor and coupled to the switch, the drive circuit configured to receive a command to control an operation of the solenoid, wherein the drive circuit is at least one of a pulse-width modulated (PWM) based current drive circuit or a DC-DC converter circuit;
   a detector for detecting at least one of a current or voltage of the solenoid, wherein the detector is coupled to the drive circuit; and
   a timer-based circuit coupled to the drive circuit, wherein the timer-based circuit comprises a monostable multivibrator and a D-flip flop circuit.

2. The system of claim 1, wherein the command to control the operation of the solenoid is received from the timer-based circuit.

3. The system of claim 1, wherein the drive circuit is a PWM-based current drive circuit and is coupled to a comparator-based autonomous mode change circuit comprising a comparator, wherein the command to control an operation of the solenoid is determined by the comparator.

4. The system of claim 3, wherein if the comparator determines that an average duty cycle DC of the PWM-based current drive circuit is greater than a reference signal, the command is a Pull-in mode command, otherwise the command is a Hold mode command.

5. The system of claim 1, wherein the drive circuit is the DC-DC converter coupled to a current sense amplifier and a comparator with hysteresis, wherein the comparator with hysteresis is configured to control a gain of the current sense amplifier based on the detector.

6. The system of claim 5, wherein the current sense amplifier is configured to send a feedback signal to the DC-DC converter to select an output voltage to supply the solenoid.

7. The system of claim 1, wherein the detector is configured to detect a solenoid current has reached a maximum pull-in current, switch the solenoid from a first mode to a second mode, wherein the first mode is a Pull-in mode and the second mode is a Hold mode.

8. The system of claim 1, wherein the detector is configured to detect a solenoid current is less than a maximum hold current, switch the solenoid from a second mode to a first mode, wherein the first mode is a Pull-in mode and the second mode is a Hold mode.

9. A method comprising:
   initiating, by a processor, an operation of a solenoid;
   receiving a command to control the operation of the solenoid;
   controlling, by a drive circuit, a switch coupled to the solenoid based at least in part on the command, wherein the drive circuit is at least one of a pulse-width modulated (PWM) based current drive circuit or a DC-DC converter circuit; and
   detecting at least one of a current or voltage of the solenoid, and subsequently controlling the operation of the solenoid based at least in part on the detection; and
   operating a timer-based circuit coupled to the drive circuit, wherein the timer-based circuit comprises a monostable multivibrator and a D-flip flop circuit.

10. The method of claim 9, wherein the command to control the operation of the solenoid is received from the timer-based circuit.

11. The method of claim 10, wherein the drive circuit is a PWM-based current drive circuit and is coupled to a comparator-based autonomous mode change circuit comprising a comparator, wherein the command to control an operation of the solenoid is determined by the comparator.

12. The method of claim 11, wherein if the comparator determines a duty cycle of the PWM-based current drive circuit is greater than a reference signal, the command is a Pull-in mode command,
   otherwise the command is a Hold mode command.

13. The method of claim 9, wherein the drive circuit is the DC-DC converter coupled to a current sense amplifier and a comparator with hysteresis, wherein the comparator with hysteresis is configured to control a gain of the current sense amplifier based on the detector.

14. The method of claim 13, wherein the current sense amplifier is configured to send a feedback signal to the DC-DC converter to select an output voltage to supply the solenoid.

15. The method of claim 9, responsive to detecting a solenoid current has reached a maximum pull-in current, switching the solenoid from a first mode to a second mode, wherein the first mode is a Pull-in mode and the second mode is a Hold mode.

16. The method of claim 9, responsive to detecting a solenoid current is less than a maximum hold current, switching the solenoid from a second mode to a first mode, wherein the first mode is a Pull-in mode and the second mode is a Hold mode.

\* \* \* \* \*